United States Patent
Ando et al.

(10) Patent No.: US 6,700,303 B2
(45) Date of Patent: Mar. 2, 2004

(54) PIEZOELECTRIC ELEMENT

(75) Inventors: Akira Ando, Omihachiman (JP);
Masahiko Kimura, Kusatsu (JP);
Takuya Sawada, Moriyama (JP)

(73) Assignee: Murata Manufacturing Co. Ltd (JP)

(*) Notice: Subject to any disclaimer, the term of this patent is extended or adjusted under 35 U.S.C. 154(b) by 81 days.

(21) Appl. No.: 10/322,936

(22) Filed: Dec. 18, 2002

(65) Prior Publication Data

US 2003/0085636 A1 May 8, 2003

Related U.S. Application Data (63) Continuation of application No. 09/636,500, filed on Aug. 11, 2000.

(30) Foreign Application Priority Data

| Aug. 16, 1999 | (JP) | 11-229732 |
| Aug. 16, 1999 | (JP) | 11-229733 |
| May 31, 2000 | (JP) | 2000-161829 |
| May 31, 2000 | (JP) | 2000-161830 |
| Jun. 28, 2000 | (JP) | 2000-193899 |

(51) Int. Cl.$^7$ ............................................. H01L 41/08
(52) U.S. Cl. ..................... 310/320; 310/358; 310/366
(58) Field of Search ..................... 310/320, 306, 310/360, 365, 358

(56) References Cited

U.S. PATENT DOCUMENTS 4,918,350 A * 4/1990 Ando et al. ................. 310/320
6,369,488 B1 * 4/2002 Ando et al. ................. 310/320
6,515,401 B1 * 2/2003 Ando et al. ................. 310/320

FOREIGN PATENT DOCUMENTS

| JP | 55-16380 | 5/1980 |
| JP | 1-191508 | 8/1989 |
| JP | 6-37579 | 2/1994 |
| JP | 6-116010 | 4/1994 |
| JP | 10-139552 | 5/1998 |
| JP | 11-4134 | 1/1999 |

OTHER PUBLICATIONS

Japanese Examination Reports mailed Jan. 21, 2003 (w/English translation of relevant portion).

* cited by examiner

*Primary Examiner*—Mark Budd
(74) *Attorney, Agent, or Firm*—Dickstein, Shapiro, Morin & Oshinsky, LLP.

(57) ABSTRACT

A piezoelectric element includes a plurality of piezoelectric layers composed of a piezoelectric material containing Sr, Bi, Ti, and O, at least three vibration electrodes opposing each other, each disposed among the piezoelectric layers, and an energy-confining region formed in a region in which the vibration electrodes overlap, the energy-confining region being parallel to the planes of the vibration electrodes and exciting an n-th order longitudinal thickness vibration. The maximum length L of a secant between two intersections on the periphery of the energy-confining region and the distance t between the topmost vibration electrode and the bottommost vibration electrode satisfy the relationship nL/t of less than 10. The piezoelectric element is thermally stable and has a narrow allowable error.

14 Claims, 8 Drawing Sheets

POLARIZATION DIRECTION

POLARIZATION DIRECTION

PIEZOELECTRIC ELEMENT

This is a continuation of application Ser. No. 09/636,500 filed Aug. 11, 2000.

BACKGROUND OF THE INVENTION

1. Field of the Invention

The present invention relates to piezoelectric elements and particularly energy-confinement piezoelectric elements using a thickness vibration mode.

2. Description of the Related Art

Energy-confinement piezoelectric elements fall into two primary categories: those which excite fundamental frequency thickness vibrations in the piezoelectric bodies in the area between the vibration electrodes and those which excite higher-order (harmonic) thickness vibrations in this area. Piezoelectric elements which excite fundamental thickness vibrations will only operate when piezoelectric materials having relatively high Poisson's ratios are used. This is not the case with piezoelectric elements which excite harmonic thickness vibrations. Such piezoelectric elements are not substantially affected by the Poisson's ratio, and do not suffer this drawback.

In general, thermally stable materials such as lead titanate have Poisson's ratios of less than one-third which do not achieve frequency-reducing energy confinement of the fundamental thickness vibration. Such materials can be used, however, in piezoelectric elements which excite harmonic thickness vibrations, and this has attracted attention as a technology for achieving high-performance piezoelectric elements.

However, the energy-confinement elements exciting thickness vibration harmonic waves have different optimized electrode structures depending on the piezoelectric material being used, with the result that the optimum geometry of the piezoelectric element must be determined as a function of the material being used.

In an energy-confinement element, it is known that the resonant frequency of a spurious vibration called an anharmonic overtone is present near the primary harmonic resonant frequency. The anharmonic overtone is not excited when the electrode diameter, that is, the energy-confinement region, is reduced. Since the maximum electrode diameter not causing the anharmonic overtone excitation depends on the piezoelectric material being used, the maximum electrode diameter must be separately determined for each material. A non-oriented layered bismuth-based ceramic material is thermally stable and has a small electromechanical coupling coefficient, and thus, it is expected that it could be used as a high-performance oscillator having a narrow allowable error. However, the maximum electrode diameter thereof which will not excite the undesirable anharmonic overtone has not been determined.

SUMMARY OF THE INVENTION

It is an object of the present invention to provide a thermally stable piezoelectric element in which a high-performance oscillator having a narrow allowable error can be achieved.

In accordance with the present invention, a piezoelectric element includes a plurality of piezoelectric layers comprising a piezoelectric material comprising Sr, Bi, Ti, and O, at least three vibration electrodes opposing each other, each disposed among the piezoelectric layers, and an energy-confining region formed in a region in which the vibration electrodes overlap. The energy-confining region being parallel to the planes of the vibration electrodes and excites an n-th harmonic longitudinal thickness vibration. The maximum length L of a secant between two intersections on the periphery of the energy-confining region and the distance t between the topmost vibration electrode and the bottommost vibration electrode satisfy the relationship nL/t of < than 10, wherein n is an integer greater than 1.

Preferably, the piezoelectric material comprises $SrBi_4Ti_4O_{15}$.

Preferably, the topmost vibration electrode and the bottommost vibration electrode are formed on the outer surfaces of the piezoelectric layers.

Alternatively, the piezoelectric material comprises Ca, Bi, Ti, and O, and the value of the ratio nL/t is less than 9. In such a case, the piezoelectric material preferably comprises $CaBi_4Ti_4O_{15}$.

Alternatively, the piezoelectric material comprises Sr, Bi, Nb, and O, and the value of the ratio nL/t is less than 10. In such a case, the piezoelectric material preferably comprises $SrBi_2Nb_2O_9$.

BRIEF DESCRIPTION OF THE DRAWINGS

Other features and advantages of the present invention will become apparent from the following description of the invention which refers to the accompanying drawings.

DETAILED DESCRIPTION OF EMBODIMENTS OF THE INVENTION

Figure 1:
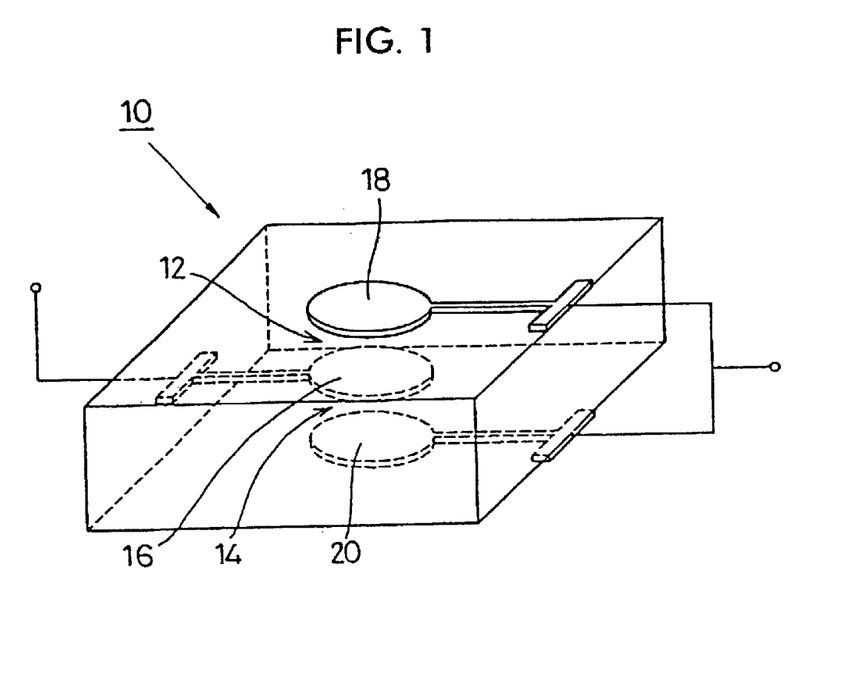
FIG. 1 is a schematic view of an embodiment of a piezoelectric element of the present invention.
Figure 2:
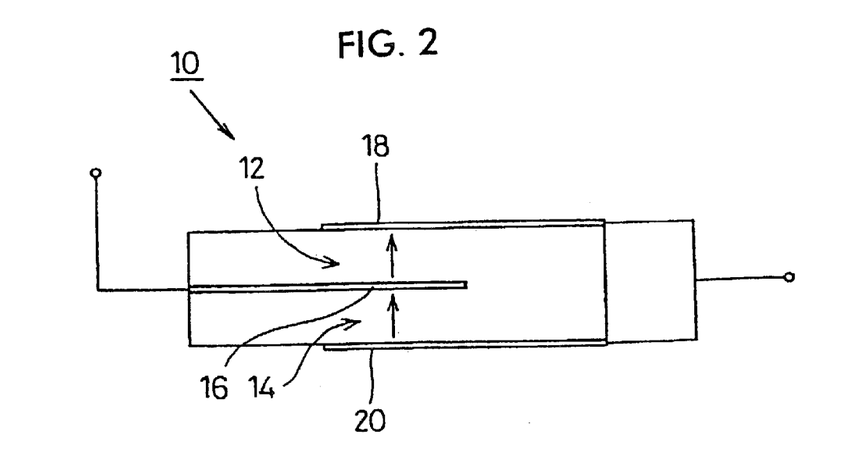
FIG. 2 is a schematic side view of the piezoelectric element shown in FIG. 1.

FIG. 1 is a schematic view of a piezoelectric element constructed in accordance with the principles of the present invention, and FIG. 2 is a side view of the piezoelectric element in FIG. 1. A piezoelectric element 10 includes, for example, two piezoelectric layers 12 and 14. The piezoelectric layers 12 and 14 are preferably composed of a piezoelectric ceramic material containing Sr, Bi, Ti, and O as major components. A typical piezoelectric material is $SrBi_4Ti_4O_{15}$. A first vibration electrode 16, which is disk shaped in this embodiment, is provided substantially in the center between piezoelectric layers 12 and 14. The first vibration electrode 16 is led out at one end of the laminate of the piezoelectric layers 12 and 14. A disk-shaped second vibration electrode 18 is formed on the outer surface of the piezoelectric layer 12 so as to oppose the first vibration electrode 16. The second vibration electrode 18 is led out at the opposite end of the laminate. A third vibration electrode 20 is formed on the outer surface of the piezoelectric layer 14 so as to oppose the first vibration electrode 16. The third vibration electrode 20 is led out at the same end as that for the second vibration electrode 18. Preferably, but not necessarily, the first vibration electrode 16, the second vibration electrode 18, and the third vibration electrode 20 all have the same diameter.

The piezoelectric element 10 is used as an energy-confinement piezoelectric element. The energy-confining regions are present between the overlapping portion (as viewed perpendicular to the plane of the electrodes) of the first, second and third vibration electrodes 16, 18 and 20. Stated otherwise, vibration electrodes 16, 18, and 20 overlap in the energy-confining regions.

Applicants have discovered that improved characteristics are obtained by properly dimensioning the overlapping portion of the electrodes and the spacing between the electrodes as a function of:

(a) the maximum length of a secant L which is parallel to the vibration electrodes 16, 18, and 20 and which is defined by intersections on the periphery of the energy-confining region (in the piezoelectric element 10 shown in FIG. 1, the maximum length L corresponds to the diameter of the disk vibration electrodes 16, 18, and 20);

(b) the distance t between the bottom surface of the second vibration electrode 18 and the upper surface of the third vibration electrode 20, (in the preferred embodiment, between the opposing outer surfaces in the energy-confining region); and (c) the n-th order thickness vibration (for the fundamental thickness vibration n=1, for the primary harmonic vibration, n=2, etc.).

Particularly, improved characteristics are achieved when nL/t<10, n being an integer greater than 1.

In this piezoelectric element 10, a piezoelectric material containing Sr, Bi, Ti, and O as major components, such as $SrBi_4Ti_4O_{15}$ is used. Thus, the piezoelectric element 10 is thermally stable, has a small electromechanical coupling coefficient, and can be used as a high-performance oscillator having a narrow allowable error. When the value of nL/t ratio is less than 10, the anharmonic overtone is not excited.

EXAMPLE 1

Figure 3:
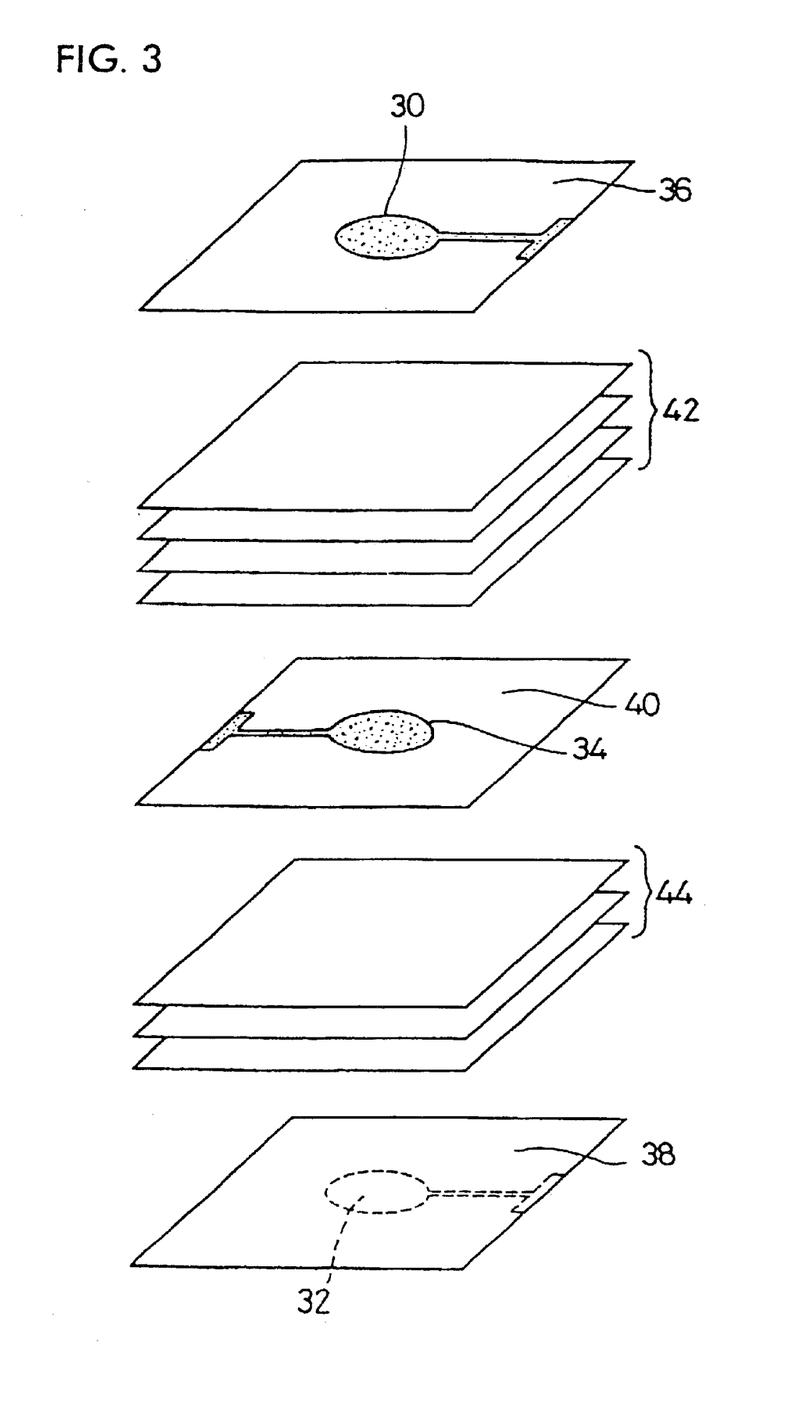
FIG. 3 is an exploded view showing production steps of a piezoelectric element.

As starting materials, $SrCO_3$, $Bi_2O_3$, $TiO_2$, and $MnCO_3$, were prepared. These materials were weighed and mixed so that the composition was expressed by $SrBi_4Ti_4O_{15}+1\%$ by weight of $MnO_2$. The powdered mixture was calcined at 800 to 1,000° C., and sheets were formed by a doctor blade process. Using the resulting sheets, as shown in FIG. 3, sheets 36, 38, and 40 having a second vibration electrode pattern 30, a third vibration electrode pattern 32, and a first vibration electrode pattern 34, respectively, were formed. These electrode patterns 30, 32, and 34 were composed of platinum and were formed by a printing process. A plurality of sheets 42 were disposed between the sheet 36 and the sheet 40 and a plurality of sheets 44 were disposed between the sheet 38 and the sheet 40. These sheets 36, 38, 40, 42, and 44 were laminated and compressed under a pressure of 200 MPa ($2\times10^8$ kg/m$^2$) and were sintered at 1,150 to 1,300° C. for 1 to 5 hours. The sintered compact was polarized in the direction of the arrows in FIG. 2 to prepare the piezoelectric element shown in FIGS. 1 and 2.

Figure 4:
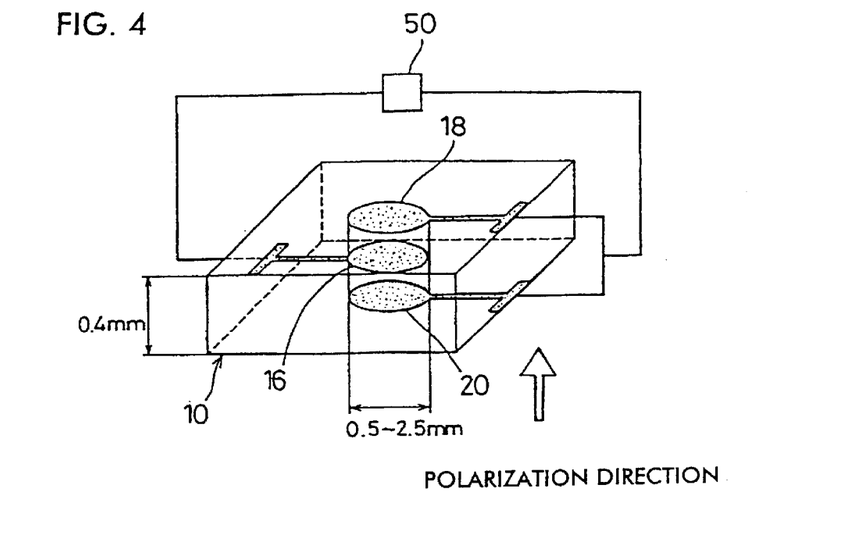
FIG. 4 a schematic view of a testing circuit for a piezoelectric element.

The diameter of the energy-confining region of the sintered piezoelectric element, that is, the diameter of the disk portions of these vibration electrodes, was set to be 0.4 to 2.6 mm. The total thickness of the sintered piezoelectric element, that is, the distance between the second vibration electrode 18 and the third vibration electrode 20, was set to be 0.4 mm. As shown in FIG. 4, an impedance analyzer 50 was connected between the second vibration electrode 18 and the first vibration electrode 16 and between the first vibration electrode 16 and the third vibration electrode 20 to excite the piezoelectric vibration.

Figure 5:
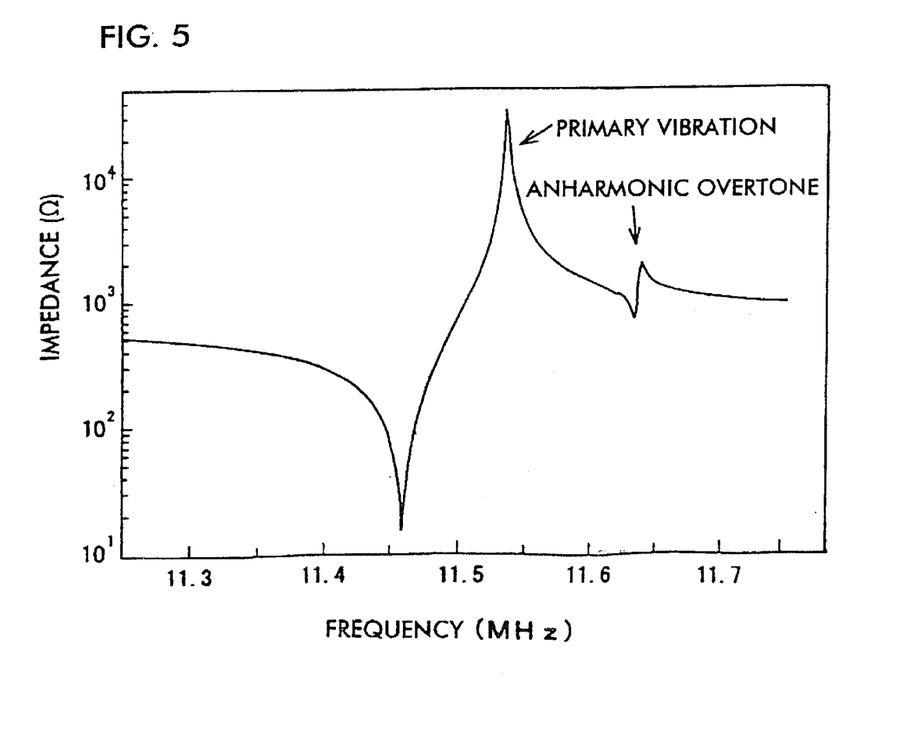
FIG. 5 is a graph of the impedance versus frequency characteristic when the diameter of an energy-confining region is 2 mm in Example 1.

In order to evaluate the energy confinement of second harmonic waves using such a piezoelectric element, the impedance versus frequency characteristic was measured. FIG. 5 is a graph showing the impedance versus frequency characteristic at an electrode diameter of 2 mm. Since n=2, L=2 mm, and t=0.4 mm, the ratio nL/t is 10. In this piezoelectric element, an anharmonic overtone was undesirably superimposed on the resonant frequency of the primary harmonic vibration.

Figure 6:
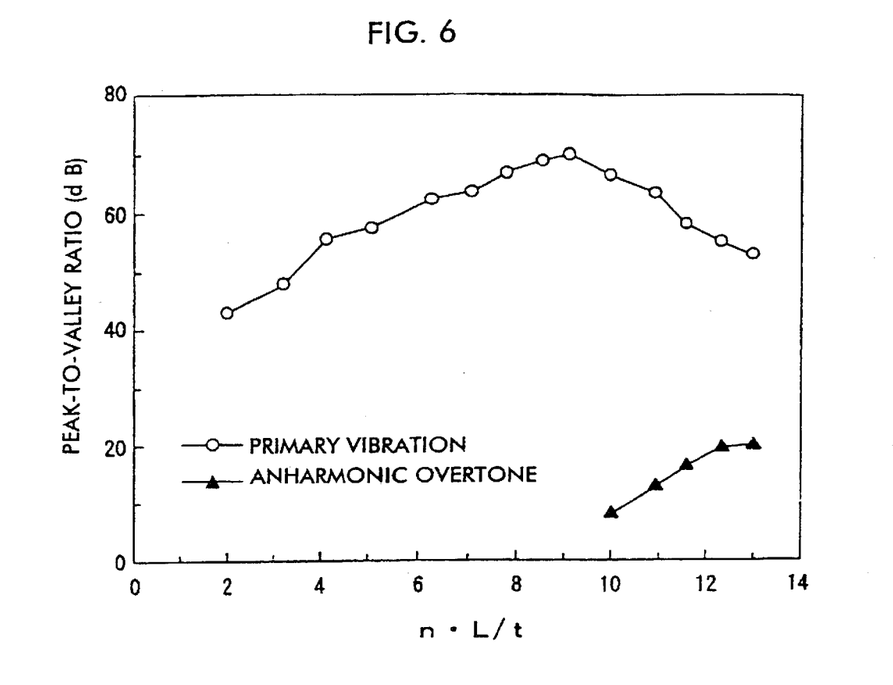
FIG. 6 is a graph of the top-to-valley ratio of the impedance of a piezoelectric element when the value of nL/t is varied in Example 1.

FIG. 6 shows the relationship between the peak-to-valley ratio of the primary harmonic vibration (the ratio of the resonant impedance to the antiresonant impedance) and the index nL/t and the relationship between the peak-to-valley ratio of the anharmonic overtone and the index nL/t. The anharmonic overtone starts to be superimposed at an nL/t ratio of 10 or more. When the piezoelectric element is used as an oscillator, the anharmonic overtone causes abnormal oscillation or suspended oscillation.

Thus, in a piezoelectric element using a layered bismuth material containing Sr, Bi, Ti, and O, such as $SrBi_4Ti_4O_{15}$, in which thickness vibration higher harmonic waves are excited by an internal electrode structure, the size of the electrodes is designed so that the value of the ratio nL/t is 10 or less. As a result, the piezoelectric element is thermally stable and has a narrow allowable error.

Figure 7:
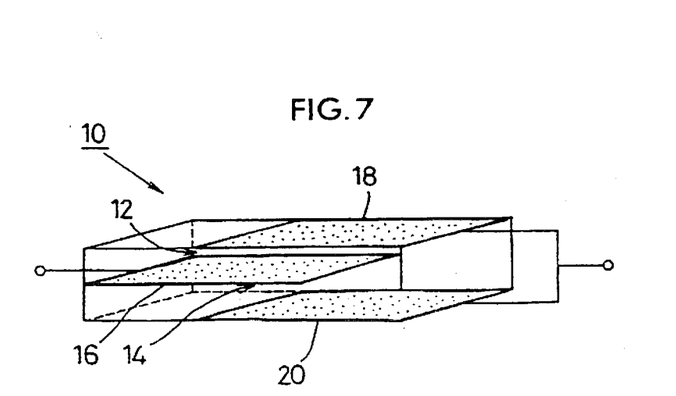
FIG. 7 is a schematic view of another embodiment of the piezoelectric element of the present invention.

The shape of the energy-confinement electrodes may be elliptic, square, oblong, or polygonal, or irregular instead of the disk shape shown in FIG. 1. When such electrodes are all the same size and shape and fully overlap one another, L is the longest portion of the electrodes, for example, the length of the long axis in the ellipse, or the length of the diagonal line in the square or oblong. Alternatively, the electrodes may only partially overlap one another and/or may have different sizes or shapes than each other. For example, the electrodes may be rectangular and only partially overlap as shown in FIG. 7. In this case, a region in which the vibration electrodes 16, 18, and 20 overlap (i.e., a region defined by vertical lines extending perpendicular to electrodes and defining the area of overlap of the electrodes) is the energy-confining region and L is the longest dimension of that region.

In the above embodiment, Mn was added to the composition containing $SrBi_4Ti_4O_{15}$ as the major component. Nd and Y may also be added. Sr and Ti may be partially replaced with other elements. Moreover, the piezoelectric material containing Sr, Bi, Ti, and O as major components may further contain auxiliary components, such as glass components in order to improve the sinterability of the ceramic.

Among the three vibration electrodes, the two outer vibration electrodes in the thickness direction are not necessarily formed on the outer surfaces of the element, and piezoelectric layers may be provided at the exteriors of the vibration electrodes. Preferably, but not necessarily, the two outer vibration electrodes are formed on the outermost portions of the element as external electrodes, in other words, no piezoelectric layer is formed on the outer faces of the vibration electrodes. When the piezoelectric element is used as, for example, an oscillator or filter, the resonant frequency is adjusted to a desired value. Though the type of the piezoelectric material and the vibration electrodes and the thickness of the element determine the resonant frequency, the final adjustment is often performed by mass loading on the vibration electrodes by applying paint onto the vibration electrodes. This method is readily applicable when the outermost vibration electrodes are exposed to the exterior. Moreover, mass loading by paint may be performed onto the vibration electrodes to suppress spurious vibrations. In such a case, the vibration electrodes are preferably external electrodes.

EXAMPLE 2

As starting materials, $CaCO_3$, $Bi_2O_3$, $TiO_2$, and $MnCO_3$, were prepared. These materials were weighed and mixed so that the composition was expressed by $CaBi_4Ti_4O_{15}+1\%$ by weight of $MnO_2$. The powdered mixture was calcined at 800 to 1,000° C., and sheets were formed by a doctor blade process. Using the resulting sheets, as shown in FIG. 3, sheets 36, 38, and 40 having a second vibration electrode pattern 30, a third vibration electrode pattern 32, and a first vibration electrode pattern 34, respectively, were formed. These electrode patterns 30, 32, and 34 were composed of platinum and were formed by a printing process. A plurality of sheets 42 were disposed between the sheet 36 and the sheet 40 and a plurality of sheets 44 were disposed between the sheet 38 and the sheet 40. These sheets 36, 38, 40, 42, and 44 were laminated and compressed under a pressure of 200 MPa ($2 \times 10^8$ $kg/m^2$) and were sintered at 1,100 to 1,200° C. for 1 to 5 hours. The sintered compact was polarized in the direction of the arrows in FIG. 2 to prepare the piezoelectric element shown in FIGS. 1 and 2.

The diameter of the energy-confining region of the sintered piezoelectric element, that is, the diameter of the disk portions of these vibration electrodes, was set to be 0.5 to 2.5 mm. The total thickness of the sintered piezoelectric element, that is, the distance between the second vibration electrode 18 and the third vibration electrode 20, was set to be 0.4 mm. As shown in FIG. 4, an impedance analyzer 50 was connected between the second vibration electrode 18 and the first vibration electrode 16 and between the first vibration electrode 16 and the third vibration electrode 20 to excite the piezoelectric vibration.

Figure 8:
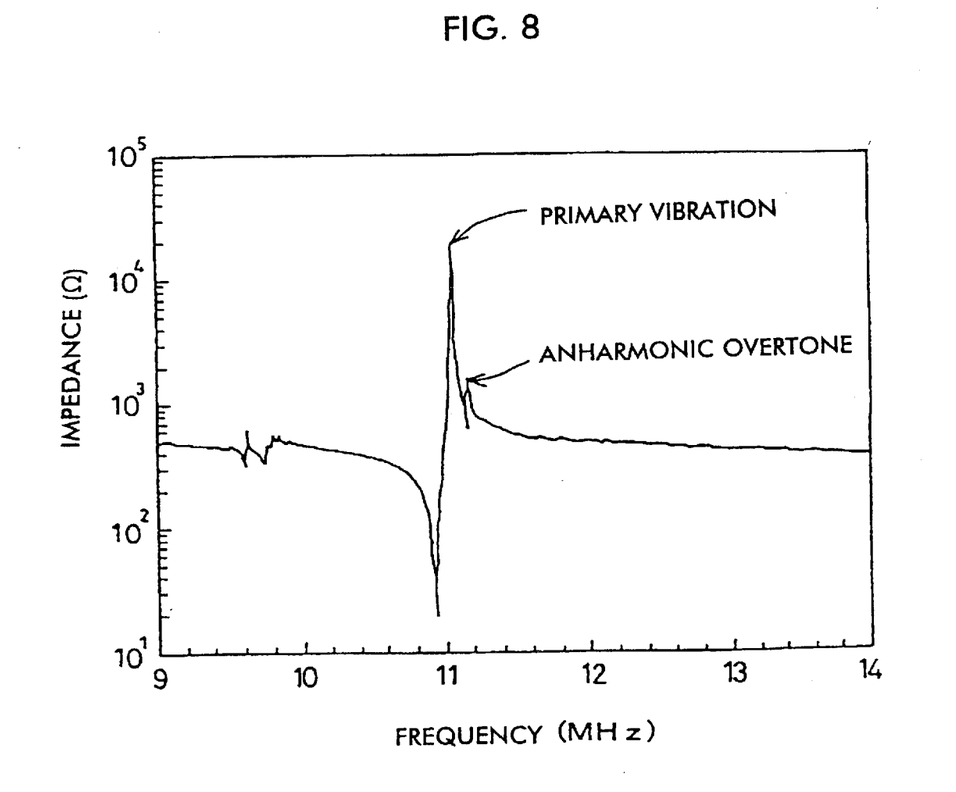
FIG. 8 is a graph of the impedance versus frequency characteristic when the diameter of an energy-confining region is 2 mm in Example 2.

In order to evaluate the energy confinement of second harmonic waves using such a piezoelectric element, the impedance versus frequency characteristic was measured. FIG. 8 is a graph showing the impedance versus frequency characteristic at an electrode diameter of 1.8 mm. Since n=2, L=1.8 mm, and t=0.4 mm, the ratio nL/t is 9. In this piezoelectric element, an anharmonic overtone was superimposed on the resonant frequency of the primary vibration.

Figure 9:
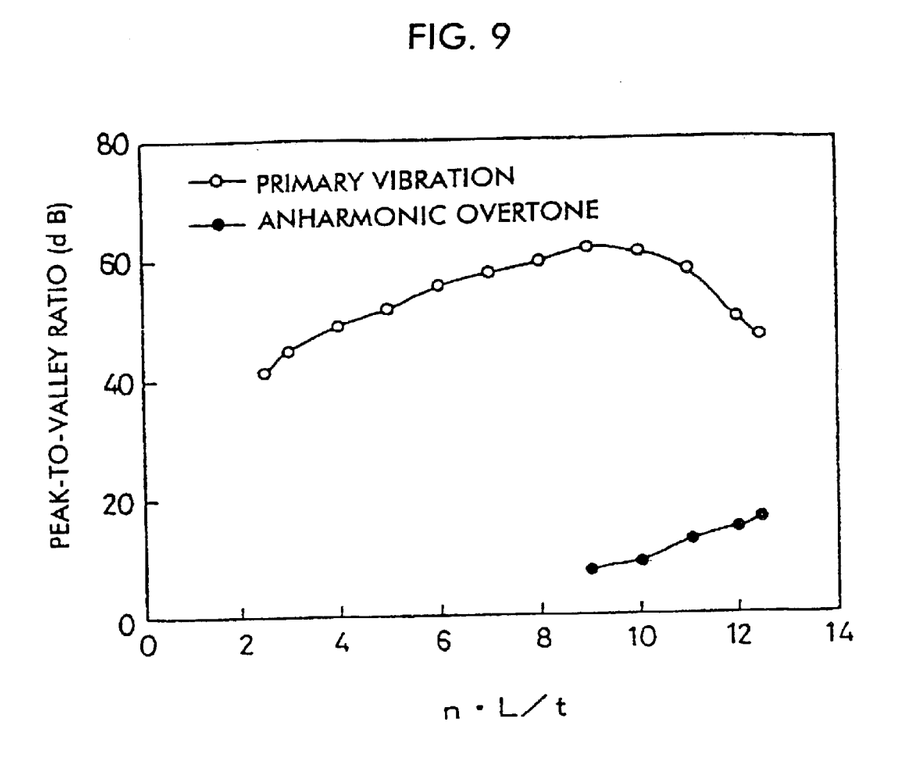
FIG. 9 is a graph of the top-to-valley ratio of the impedance of a piezoelectric element when the value of nL/t is varied in Example 2.

FIG. 9 shows the relationship between the peak-to-valley ratio of the primary vibration (the ratio of the resonant impedance to the antiresonant impedance) and the ratio nL/t and the relationship between the peak-to-valley ratio of the anharmonic overtone and the ratio nL/t. The anharmonic overtone starts to be superimposed at a ratio nL/t of 9 or more. When the piezoelectric element is used as an oscillator, the anharmonic overtone causes abnormal oscillation or suspended oscillation.

Thus, in a piezoelectric element using a layered bismuth material containing Ca, Bi, Ti, and O, such as $CaBi_4Ti_4O_{15}$, in which thickness vibration higher harmonic waves are excited by an internal electrode structure, the size of the electrodes is designed so that the value of the ratio nL/t is 9 or less. As a result, the piezoelectric element is thermally stable and has a narrow allowable error.

In the above embodiment, Mn was added to the composition containing $CaBi_4Ti_4O_{15}$ as the major component. Si and W may also be added. Ca and Ti may be partially replaced with other elements. Moreover, the piezoelectric material containing Ca, Bi, Ti, and O as major components may further contain auxiliary components, such as glass components in order to improve the sinterability of the ceramic.

EXAMPLE 3

As starting materials, $SrCO_3$, $Bi_2O_3$, $Nb_2O_3$, and $MnCO_3$, were prepared. These materials were weighed and mixed so that the composition was expressed by $SrBi_2Nb_2O_9+1\%$ by weight of $MnO_2$. The powdered mixture was calcined at 800 to 1,000° C., and sheets were formed by a doctor blade process. Using the resulting sheets, as shown in FIG. 3, sheets 36, 38, and 40 having a second vibration electrode pattern 30, a third vibration electrode pattern 32, and a first vibration electrode pattern 34, respectively, were formed. These electrode patterns 30, 32, and 34 were composed of platinum and were formed by a printing process. A plurality of sheets 42 were disposed between the sheet 36 and the sheet 40 and a plurality of sheets 44 were disposed between the sheet 38 and the sheet 40. These sheets 36, 38, 40, 42, and 44 were laminated and compressed under a pressure of 200 MPa ($2 \times 10^8$ $kg/m^2$) and were sintered at 1,100 to 1,200° C. for 1 to 5 hours. The sintered compact was polarized in the direction of the arrows in FIG. 2 to prepare the piezoelectric element shown in FIGS. 1 and 2.

The diameter of the energy-confining region of the sintered piezoelectric element, that is, the diameter of the disk portions of these vibration electrodes, was set to be 0.5 to 2.5 mm. The total thickness of the sintered piezoelectric element, that is, the distance between the second vibration electrode 18 and the third vibration electrode 20, was set to be 0.4 mm. As shown in FIG. 4, an impedance analyzer 50 was connected between the second vibration electrode 18 and the first vibration electrode 16 and between the first vibration electrode 16 and the third vibration electrode 20 to excite the piezoelectric vibration.

Figure 10:
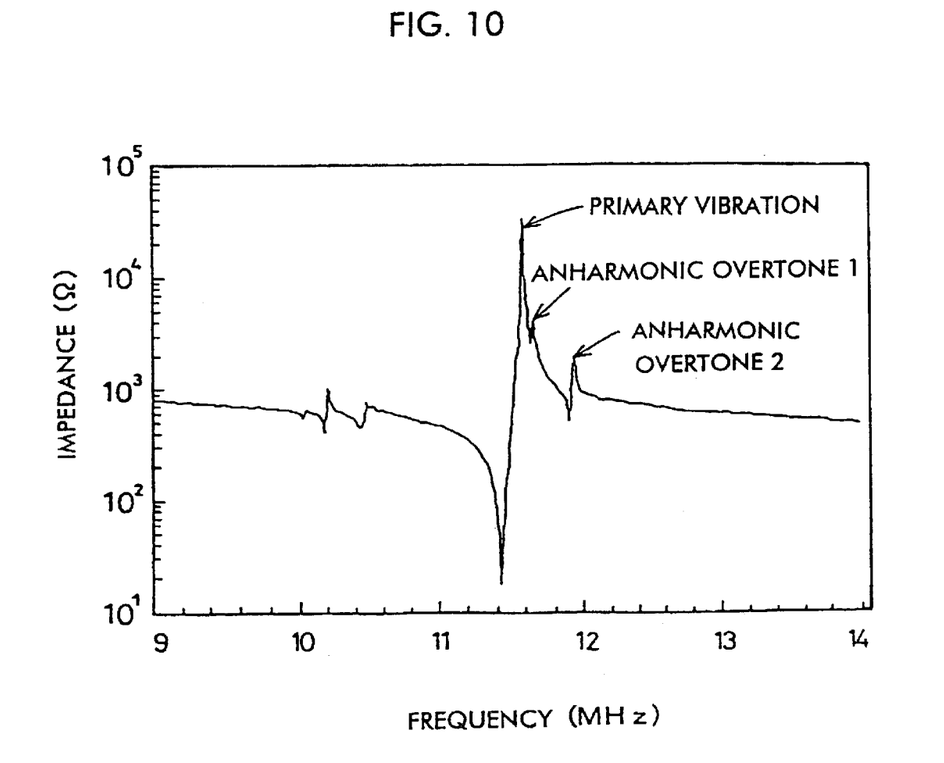
FIG. 10 is a graph of the impedance versus frequency characteristic when the diameter of an energy-confining region is 2 mm in Example 3.

In order to evaluate the energy confinement of second harmonic waves using such a piezoelectric element, the impedance versus frequency characteristic was measured. FIG. 10 is a graph showing the impedance versus frequency characteristic at an electrode diameter of 2 mm. Since n=2, L=2 mm, and t=0.4 mm, nL/t becomes 10. In this piezoelectric element, an anharmonic overtone was superimposed on the resonant frequency of the primary vibration.

Figure 11:
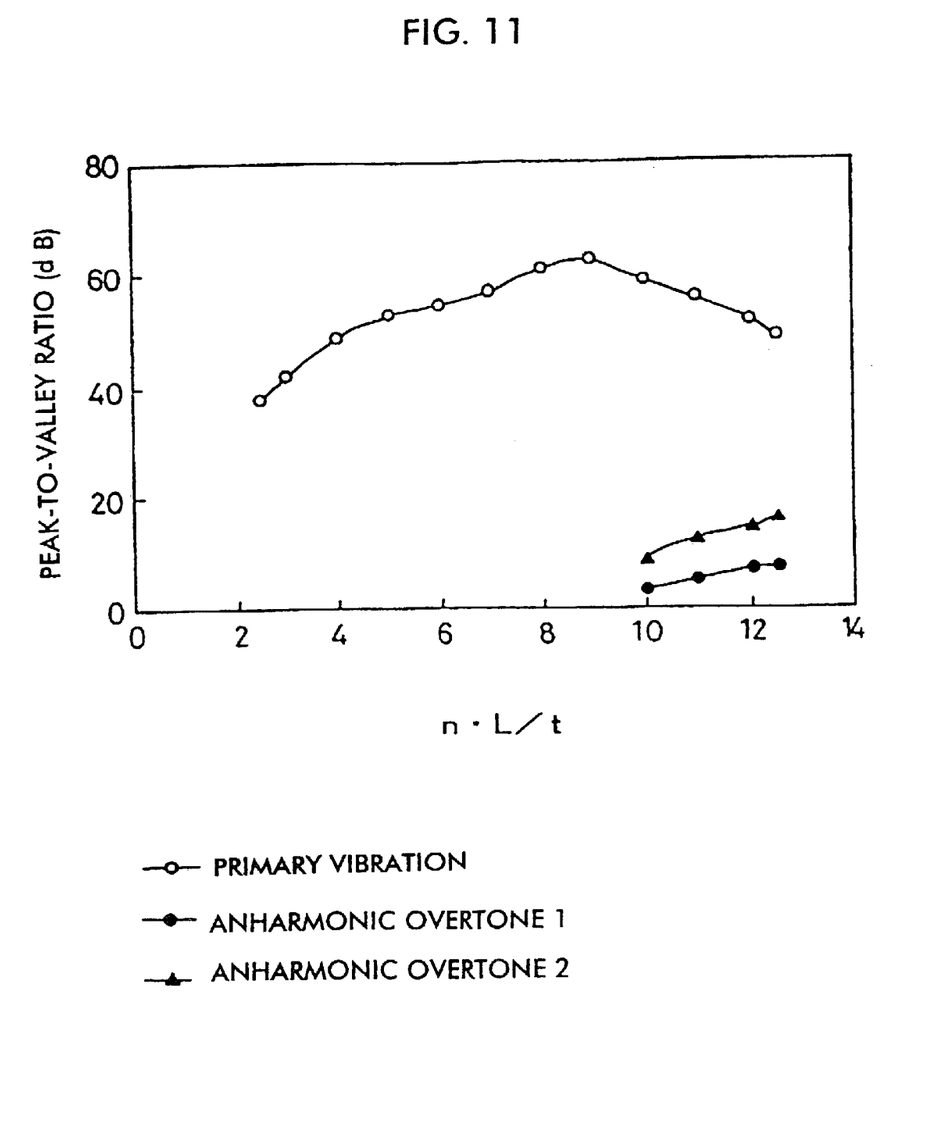
FIG. 11 is a graph of the top-to-valley ratio of the impedance of a piezoelectric element when the value of nL/t is varied in Example 3.

FIG. 11 shows the relationship between the peak-to-valley ratio of the primary vibration (the ratio of the resonant impedance to the antiresonant impedance) and the index nL/t and the relationship between the peak-to-valley ratio of the anharmonic overtone and the index nL/t. The anharmonic overtone starts to be superimposed at an nL/t ratio of 10 or more. When the piezoelectric element is used as an oscillator, the anharmonic overtone causes abnormal oscillation or suspended oscillation.

Thus, in a piezoelectric element using a layered bismuth material containing Sr, Bi, Nb, and O, such as $SrBi_2Nb_2O_9$, in which thickness vibration higher harmonic waves are excited by an internal electrode structure, the size of the electrodes is designed so that the value of nL/t ratio is 10 or less. As a result, the piezoelectric element is thermally stable and has a narrow allowable error.

In the above embodiment, Mn was added to the composition containing $SrBi_2Nb_2O_9$ as the major component. Si and W may also be added. Sr and Nb may be partially replaced with other elements. Moreover, the piezoelectric material containing Sr, Bi, Nb, and O as major components may further contain auxiliary components, such as glass components in order to improve the sinterability of the ceramic.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A piezoelectric element comprising:
   a plurality of piezoelectric layers comprising a piezoelectric material which is a bismuth based ceramic comprising Sr, Bi, Ti, and O;
   at least three vibration electrodes opposing each other, each disposed among the piezoelectric layers; and
   an energy-confining region formed in a region in which the vibration electrodes overlap and exciting an n-th order longitudinal thickness vibration;
   wherein the maximum length L of a secant between two intersections on the periphery of the energy-confining region and the distance t between the topmost vibration electrode and the bottommost vibration electrode satisfy the ratio nL/t<10, wherein n is greater than 1.

2. A piezoelectric element according to claim 1, wherein the piezoelectric material comprises $SrBi_4Ti_4O_{15}$.

3. A piezoelectric element comprising:
   a plurality of piezoelectric layers comprising a piezoelectric material which is a bismuth based ceramic comprising Ca, Bi, Ti, and O;
   at least three vibration electrodes opposing each other, each disposed among the piezoelectric layers; and
   an energy-confining region formed in a region in which the vibration electrodes overlap and exciting an n-th order longitudinal thickness vibration;
   wherein the maximum length L of a secant between two intersections on the periphery of the energy-confining region and the distance t between the topmost vibration electrode and the bottommost vibration electrode satisfy the ratio nL/t<9, wherein n is an integer greater than 1.

4. A piezoelectric element according to claim 3, wherein the piezoelectric material comprises $CaBi_4Ti_4O_{15}$.

5. A piezoelectric element comprising:
   a plurality of piezoelectric layers comprising a piezoelectric material which is a bismuth based ceramic comprising Sr, Bi, Nb, and O;
   at least three vibration electrodes opposing each other, each disposed among the piezoelectric layers; and
   an energy-confining region formed in a region in which the vibration electrodes overlap and exciting an n-th order longitudinal thickness vibration;
   wherein the maximum length L of a secant between two intersections on the periphery of the energy-confining region and the distance t between the topmost vibration electrode and the bottommost vibration electrode satisfy the ratio nL/t<10, wherein n is an integer greater than 1.

6. A piezoelectric element according to claim 5, wherein the piezoelectric material comprises $SrBi_2Nb_2O_9$.

7. A piezoelectric element according to claim 1, wherein the topmost vibration electrode and the bottommost vibration electrode are formed on the outer surfaces of the piezoelectric layers.

8. A piezoelectric element according to claim 2, wherein the topmost vibration electrode and the bottommost vibration electrode are formed on the outer surfaces of the piezoelectric layers.

9. A piezoelectric element according to claim 3, wherein the topmost vibration electrode and the bottommost vibration electrode are formed on the outer surfaces of the piezoelectric layers.

10. A piezoelectric element according to claim 4, wherein the topmost vibration electrode and the bottommost vibration electrode are formed on the outer surfaces of the piezoelectric layers.

11. A piezoelectric element according to claim 5, wherein the topmost vibration electrode and the bottommost vibration electrode are formed on the outer surfaces of the piezoelectric layers.

12. A piezoelectric element according to claim 2 in which the ratio nL/t is at least 2.

13. A piezoelectric element according to claim 4 in which the ratio nL/t is at least 2.

14. A piezoelectric element according to claim 6 in which the ratio nL/t is at least 2.

* * * * *